(12) United States Patent
Oguma et al.

(10) Patent No.: US 10,356,946 B2
(45) Date of Patent: Jul. 16, 2019

(54) HEAT DISSIPATION STRUCTURE

(71) Applicant: KANEKA CORPORATION, Osaka (JP)

(72) Inventors: Keisuke Oguma, Osaka (JP); Aki Koukami, Osaka (JP); Kazuo Hagiwara, Osaka (JP)

(73) Assignee: Kaneka Corporation, Osaka (JP)

( * ) Notice: Subject to any disclaimer, the term of this patent is extended or adjusted under 35 U.S.C. 154(b) by 352 days.

(21) Appl. No.: 14/407,257

(22) PCT Filed: Jun. 6, 2013

(86) PCT No.: PCT/JP2013/065646
§ 371 (c)(1),
(2) Date: Dec. 11, 2014

(87) PCT Pub. No.: WO2013/187298
PCT Pub. Date: Dec. 19, 2013

(65) Prior Publication Data
US 2015/0163958 A1 Jun. 11, 2015

(30) Foreign Application Priority Data

Jun. 15, 2012 (JP) .................................. 2012-135289
Sep. 18, 2012 (JP) .................................. 2012-204951

(51) Int. Cl.
C08L 71/02 (2006.01)
C08L 33/00 (2006.01)
H01L 23/42 (2006.01)
H05K 7/20 (2006.01)
H05K 9/00 (2006.01)
H01L 23/31 (2006.01)
H01L 23/373 (2006.01)
H01L 23/552 (2006.01)
B29C 73/02 (2006.01)
H01L 23/29 (2006.01)
H01L 25/065 (2006.01)

(52) U.S. Cl.
CPC ........... *H05K 7/2039* (2013.01); *B29C 73/02* (2013.01); *C08L 33/00* (2013.01); *C08L 71/02* (2013.01); *H01L 23/295* (2013.01); *H01L 23/3121* (2013.01); *H01L 23/3737* (2013.01); *H01L 23/552* (2013.01); *H05K 7/20463* (2013.01); *H05K 9/0024* (2013.01); *H01L 23/42* (2013.01); *H01L 25/0655* (2013.01); *H01L 2924/0002* (2013.01); *H01L 2924/166* (2013.01); *H01L 2924/16151* (2013.01); *H01L 2924/16251* (2013.01); *H01L 2924/3025* (2013.01)

(58) Field of Classification Search
None
See application file for complete search history.

(56) References Cited

U.S. PATENT DOCUMENTS

| 2011/0038124 A1 | 2/2011 | Burnham et al. |
| 2011/0101543 A1 | 5/2011 | Hayashi et al. |
| 2012/0320539 A1 | 12/2012 | Kowada et al. |

FOREIGN PATENT DOCUMENTS

| CN | 101902098 | | 12/2010 |
| CN | 102017016 | | 4/2011 |
| JP | 5-067893 | | 3/1993 |
| JP | 7-249715 | | 9/1995 |
| JP | 2000-332169 | | 11/2000 |
| JP | 2001-251088 | | 9/2001 |
| JP | 2003-015839 | | 1/2003 |
| JP | 2003-027025 | | 1/2003 |
| JP | 2005-129820 | | 5/2005 |
| JP | 2006-096986 | | 4/2006 |
| JP | 2010-053331 | | 3/2010 |
| JP | 2010-171030 | | 8/2010 |
| JP | 2010-171129 | | 8/2010 |
| JP | 2011-044448 | | 3/2011 |
| JP | 2011-187899 | | 9/2011 |
| JP | 2011-187899 A | * | 9/2011 |
| JP | 2011-236365 | | 11/2011 |
| WO | 95/27308 | | 10/1995 |
| WO | 2011/158412 | | 12/2011 |

\* cited by examiner

Primary Examiner — Sheeba Ahmed
(74) Attorney, Agent, or Firm — Hamre, Schumann, Mueller & Larson, P.C.

(57) ABSTRACT

The present invention provides a heat dissipation structure that does not cause problems such as contact failures in electronic components and that is applicable to electronic components with high heat densities. The present invention also provides a method for easily repairing an electronic device. The heat dissipation structure is obtained by filling and curing a thermally conductive curable resin composition in an electromagnetic shielding case on a substrate on which an electronic component with a heat density of 0.2 W/cm² to 500 W/cm² is mounted, the thermally conductive curable resin composition containing a curable liquid resin (I) and a thermally conductive filler (II), having a viscosity at 23° C. of 30 Pa·s to 3000 Pa·s and a thermal conductivity of 0.5 W/(m·K) or more, and being curable by moisture or heat.

8 Claims, 2 Drawing Sheets

HEAT DISSIPATION STRUCTURE

TECHNICAL FIELD

The present invention relates to a heat dissipation structure obtained by filling and curing a thermally conductive curable resin composition in an electromagnetic shielding case on a substrate for use in electronic devices, precision apparatus, or the like.

BACKGROUND ART

To prevent superimposition of external electromagnetic waves as noise on input and output signals to and from electronic components (components that generate heat while electronic devices are being operated) as well as superimposition of electromagnetic waves generated from the electronic components themselves as noise on other signals, it has conventionally been proposed to shield electromagnetic waves entering and leaving the electronic components. Electromagnetic shielding cases that are configured to cover from above one or multiple electronic components mounted on a printed circuit board with a metal case are known.

If the above structure is used, however, the electronic components are then hermetically closed and thus have problems such as that the electronic components are likely to undergo an increase in temperature and degradation, or are less likely to exert their properties, compared to other components, because these electronic components are covered by air which is a poor conductor of heat, although electromagnetic shielding properties are not adversely affected. In particular, since recent electronic components generate increased heat densities, countermeasures against heat are essential.

To provide a countermeasure against heat in such a system, Patent Literatures 1 and 2 disclose techniques in which a resin is filled into a hermetically closed space formed by a sheet metal case for electromagnetic shielding to release heat generated from electronic components mounted in the case to the outer surface of the case. However, since the thermally conductive resins disclosed are silicone resins, there is a concern regarding contact failures in electronic components due to volatilization of low molecular siloxane components or cyclic siloxane components.

Moreover, general materials used as countermeasures against heat include thermally conductive grease disclosed in Patent Literature 3 and a thermally conductive sheet disclosed in Patent Literature 4. Yet, unfortunately, the former material may leak from the system because it does not cure by nature; the latter material is not suited to fine bumps on electronic components. Thus, these materials are inadequate as countermeasures against heat from electronic components in such an electromagnetic shielding case described above.

In addition, recent personal digital assistants (e.g. smartphones and tablets) that are gaining worldwide popularity include electronic components whose operating speeds are rapidly increasing, which accompanies an increasingly large amount of heat generation per unit time. However, personal digital assistants such as smartphones and tablets cannot be provided with sufficient space for heat dissipation. Without efficient heat dissipation, their electronic components can have the problem that they will readily undergo an increase in temperature and degradation, for example. Thus, currently, there is a demand for electromagnetic shielding cases having significantly high heat dissipation efficiency as compared to conventional products.

Patent Literature 5 discloses a thermally conductive material formed from a curable acrylic resin containing a crosslinkable functional group and a thermally conductive filler. This thermally conductive material, which has not only high thermal conductivity but also fluidity before curing, can exhibit good adhesion to bumpy objects, unlike sheet-like or gel-like thermally conductive materials, thus being capable of suppressing an increase in contact thermal resistance resulting from falling off during use, air gaps, or the like. In addition, since it cures at room temperature, leakage of the thermally conductive material from the system over time, which is a problem associated with grease-like thermally conductive materials, will not occur, and volatilization of low molecular siloxane components or cyclic siloxane components, which is a problem associated with silicone-based thermally conductive materials and causes contact failures in heat-generating electronic components, cannot occur. Thus, the thermally conductive material is excellent in long-term stability.

However, thermally conductive materials are required to have handleability and workability at work sites and maintenance sites, and in particular, they need to be able to be easily peeled off from a heat-generating element or a heat-dissipating element in a process of removing the applied layer of thermally conductive material at the time of repair, inspection, or replacement of components (repairing step) and, even if the layer of thermally conductive material partially remains, the residue needs to be usable by performing a jointing process, without deterioration in properties.

In regard to such peelability of the thermally conductive material layer, for example, Patent Literature 6 discloses a curable silicone resin having improved peelability. However, since a silicone composition is used, the above-described problem of volatilization of low molecular siloxane components still exists. Furthermore, Patent Literature 7 discloses a technique relating to a curable polyisobutylene resin whose backbone skeleton consists of polyisobutylene.

CITATION LIST

Patent Literature

Patent Literature 1: JP-A H05-067893
Patent Literature 2: JP-A 2001-251088
Patent Literature 3: JP-A 2003-15839
Patent Literature 4: JP-A 2011-236365
Patent Literature 5: JP-A 2010-53331
Patent Literature 6: JP-A 2006-96986
Patent Literature 7: JP-A 2003-27025

SUMMARY OF INVENTION

Technical Problem

An object of the present invention is to provide a heat dissipation structure as a countermeasure against heat from electronic components placed in an electromagnetic shielding case on a substrate, the heat dissipation structure being obtained by filling and curing a thermally conductive curable resin composition that does not raise concerns about contact failures in electronic components due to low molecular siloxane components or the like and about leakage from the system during long-term use. Another object of the present invention is to provide a heat dissipation structure that is applicable to electronic components with high heat densities. Still another object of the present invention is to provide a method for easily repairing an electronic device.

Solution to Problem

The present invention relates to a heat dissipation structure, obtained by filling and curing a thermally conductive curable resin composition in an electromagnetic shielding case on a substrate on which an electronic component with a heat density of 0.2 W/cm$^2$ to 500 W/cm$^2$ is mounted, the thermally conductive curable resin composition containing a curable liquid resin (I) and a thermally conductive filler (II), having a viscosity at 23° C. of 30 Pa·s to 3000 Pa·s and a thermal conductivity of 0.5 W/(m·K) or more, and being curable by moisture or heat.

The curable liquid resin (I) is preferably at least one of a curable acrylic resin and a curable polypropylene oxide resin.

The cured product of the thermally conductive curable resin composition is preferably in contact with both the electromagnetic shielding case and the electronic component.

The thermally conductive curable resin composition after curing preferably has a thermal conductivity of 0.5 W/(m·K) or more.

The present invention also relates to a personal digital assistant, including the heat dissipation structure of the present invention.

The present invention also relates to an electronic device, including the heat dissipation structure of the present invention.

The present invention also relates to a method for repairing an electronic device, the method including removing a cured product of a thermally conductive curable resin composition from an assembly including the cured product joined to at least one of a heat-generating element and a heat-dissipating element, the thermally conductive curable resin composition containing a curable liquid resin (I) and a thermally conductive filler (II), having a viscosity at 23° C. of 30 Pa·s to 3000 Pa·s and a thermal conductivity of 0.5 W/(m·K) or more, and being curable by moisture or heat, wherein the cured product has a 180-degree peel strength on a SUS substrate of 0.05 N/25 mm to 1.00 N/25 mm.

The method preferably includes, after the removal of the cured product, joining at least one of the heat-generating element and the heat-dissipating element to a cured product of a thermally conductive resin composition that is the same as or different from the cured product.

Advantageous Effects of Invention

The thermally conductive curable resin composition of the present invention includes a liquid resin and thus can completely fill the inside of the electromagnetic shielding case. At the same time, the resin composition does not raise concerns about its leakage from the system over time as it cures. The heat dissipation structure of the present invention including such a thermally conductive curable resin composition can transfer heat generated from electronic components in the electromagnetic shielding case to the electromagnetic shielding case and the substrate to reduce heat generated from the electronic components, and therefore can greatly contribute to suppression of deterioration of the properties of the electronic components.

DESCRIPTION OF EMBODIMENTS

Figure 1:
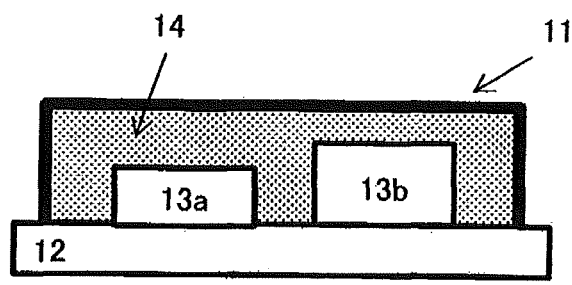
FIG. 1 is a schematic view showing an example of a heat dissipation structure according to the present invention.

The heat dissipation structure of the present invention is characteristically obtained by filling and curing a thermally conductive curable resin composition in an electromagnetic shielding case on a substrate on which an electronic component with a heat density of 0.2 W/cm$^2$ to 500 W/cm$^2$ is mounted, the thermally conductive curable resin composition containing a curable liquid resin (I) and a thermally conductive filler (II), having a viscosity at 23° C. of 30 Pa·s to 3000 Pa's and a thermal conductivity of 0.5 W/(m·K) or more, and being curable by moisture or heat.

<Curable Liquid Resin (I)>

The curable liquid resin is preferably a curable liquid resin that can be cured by moisture or heat and that has a reactive group within the molecule.

Specific examples of the curable liquid resin include curable vinyl resins such as curable acrylic resins and curable methacrylic resins, curable polyether resins such as curable polyethylene oxide resins and curable polypropylene oxide resins, and curable polyolefin resins such as curable polyisobutylene resins.

Examples of reactive groups include various reactive functional groups such as an epoxy group, a hydrolyzable silyl group, a vinyl group, an acryloyl group, a SiH group, a urethane group, a carbodiimide group, and a combination of a carboxylic anhydride group and an amino group.

In the case that the curable liquid resin is cured by a combination of two types of reactive groups or by a reaction of a reactive group and a curing catalyst, the curable liquid resin may be prepared into a two-pack type composition and then two components can be mixed to exhibit curability before application to a substrate or a heat-generating element. A curable liquid resin containing a hydrolyzable silyl group is capable of being cured by a reaction with moisture in the air, and thus may be prepared into a one-pack type room temperature-curable composition. In the case of using a combination of a vinyl group, a SiH group, and a Pt catalyst, or a combination of a radical initiator and an acryloyl group, for example, the curable liquid resin may be prepared into a one-pack type curable composition or a two-pack type curable composition and then heated to a crosslinking temperature to cause curing. In general, if the entire heat dissipation structure can be easily heated to a certain degree, it is preferred to use a heat-curable composition; while if the heat dissipation structure cannot be easily heated, it is preferred to prepare a two-pack type curable composition or a moisture-curable composition, although the present invention is not limited thereto.

The curable liquid resin is preferably a curable acrylic resin or a curable polypropylene oxide resin because, for example, the problem of contamination inside the electronic device by low molecular siloxanes is then less likely to occur and because they are excellent in heat resistance and productivity/workability. Examples of curable acrylic resins include various known reactive acrylic resins. Preferred among these are acrylic oligomers having a reactive group at a molecular end. Such a curable acrylic resin is most preferably a curable acrylic resin produced by living radical polymerization, and particularly by atom transfer radical polymerization, in combination with a curing catalyst. Kaneka XMAP available from Kaneka Corporation is a well-known example of such a resin. Moreover, examples of curable polypropylene oxide resins include various known reactive polypropylene oxide resins, such as Kaneka MS polymer available from Kaneka Corporation. These curable liquid resins may be used alone or in combination of two or more.

<Thermally Conductive Filler (II)>

The thermally conductive filler used in the thermally conductive curable resin composition may be a commercially available common filler having good thermal conductivity. In particular, from various standpoints, such as thermal conductivity, availability, ability to provide electrical characteristics such as insulation properties, filling properties, and toxicity, preferred examples include carbon compounds such as graphite and diamond; metal oxides such as aluminum oxide, magnesium oxide, beryllium oxide, titanium oxide, zirconium oxide, and zinc oxide; metal nitrides such as boron nitride, aluminum nitride, and silicon nitride; metal carbides such as boron carbide, aluminum carbide, and silicon carbide; metal hydroxides such as aluminum hydroxide and magnesium hydroxide; metal carbonates such as magnesium carbonate and calcium carbonate; crystalline silica; fired products of organic polymers such as fired products of acrylonitrile polymers, fired products of furan resin, fired products of cresol resin, fired products of polyvinyl chloride, fired products of sugar, and fired products of charcoal; complex ferrites of Zn; Fe—Al—Si ternary alloys; carbonyl iron; iron nickel alloys; and metal powder.

Further, in view of availability and thermal conductivity, more preferred are graphite, aluminum oxide, magnesium oxide, titanium oxide, zinc oxide, boron nitride, aluminum nitride, silicon carbide, aluminum hydroxide, magnesium carbonate, crystalline silica, Mn—Zn soft ferrites, Ni—Zn soft ferrites, Fe—Al—Si ternary alloys (sendust), carbonyl iron, and iron nickel alloys (permalloy); still more preferred are graphite, α-alumina, hexagonal boron nitride, aluminum nitride, aluminum hydroxide, Mn—Zn soft ferrites, Ni—Zn soft ferrites, Fe—Al—Si ternary alloys (sendust), carbonyl iron, and iron nickel alloys (permalloy); and particularly preferred are spherical graphite, round or spherical α-alumina, spherical hexagonal boron nitride, aluminum nitride, aluminum hydroxide, Mn—Zn soft ferrites, Ni—Zn soft ferrites, spherical Fe—Al—Si ternary alloys (sendust), and carbonyl iron. Carbonyl iron, if used in the present invention, is desirably reduced carbonyl iron powder. The reduced carbonyl iron powder refers to carbonyl iron powder classified not as standard grade but as reduced grade, and is characteristically low in carbon content and nitrogen content as compared to the standard grade carbonyl iron powder.

Moreover, for improved dispersibility in resin, such a thermally conductive filler is preferably surface-treated, for example, by a silane coupling agent (such as vinylsilane, epoxysilane, (meth)acrylsilane, isocyanatosilane, chlorosilane, or aminosilane), a titanate coupling agent (such as alkoxy titanate or amino titanate), a fatty acid (for example, a saturated fatty acid such as caproic acid, caprylic acid, capric acid, lauric acid, myristic acid, palmitic acid, stearic acid, or behenic acid; or a unsaturated fatty acid such as sorbic acid, elaidic acid, oleic acid, linoleic acid, linolenic acid, or erucic acid), a resin acid (such as abietic acid, pimaric acid, levopimaric acid, neoabietic acid, palustric acid, dehydroabietic acid, isopimaric acid, sandaracopimaric acid, communic acid, secodehydroabietic acid, or dihydroabietic acid), or the like.

As for the amount of such a thermally conductive filler used, the volume ratio (%) of the thermally conductive filler is preferably 25% by volume or more of the total composition in order to increase the thermal conductivity of a cured product obtained from the thermally conductive curable resin composition. If the amount is less than 25% by volume, thermal conductivity tends to be insufficient. If higher thermal conductivity is desired, the amount of the thermally conductive filler used is more preferably 30% by volume or more, still more preferably 35% by volume or more, and particularly preferably 40% by volume or more of the total composition. It is also preferred that the volume ratio (%) of the thermally conductive filler be 90% by volume or less of the total composition. If the amount is more than 90% by volume, the viscosity of the thermally conductive curable resin composition before curing may be too high.

Here, the volume ratio (%) of the thermally conductive filler is calculated from the weight fractions and the specific gravities of the resin component and the thermally conductive filler using the equation below. Please note that the thermally conductive filler is simply described as "filler" in the following equation.

Filler volume ratio (% by volume)=(filler weight fraction/filler specific gravity)÷[(resin component weight fraction/resin component specific gravity)+(filler weight fraction/filler specific gravity)]×100

Herein, the resin component refers to all the components except the thermally conductive filler.

Moreover, the combined use of two or more types of thermally conductive fillers differing in particle size is suitable as a means to increase the filling ratio of the thermally conductive filler relative to the resin. In this case, the particle size ratio of thermally conductive filler having a large particle size to thermally conductive filler having a small particle size is preferably about 100/5 to 100/20.

The thermally conductive filler may consist not only of one type of thermally conductive filler but also of two or more types of different thermally conductive fillers.

<Thermally Conductive Curable Resin Composition>

The thermally conductive curable resin composition contains the curable liquid resin (I) and the thermally conductive filler (II) and is curable by moisture or heat. In addition to the two components described above, the thermally conductive curable resin composition may contain other additives as needed, such as a curing catalyst for curing the curable liquid resin, an anti-heat aging agent, a plasticizer, an extender, a thixotropy-imparting agent, a storage stabilizer, a dehydrating agent, a coupling agent, an ultraviolet light absorber, a flame retardant, an electromagnetic wave absorber, a bulking agent or a solvent.

The thermally conductive curable resin composition may optionally include various fillers other than the thermally conductive filler as long as the effects of the present invention are not impaired. Examples of various fillers other than the thermally conductive filler include, but not limited to, reinforcing fillers such as wood powder, pulp, cotton chip, asbestos, glass fiber, carbon fiber, mica, walnut shell powder, rice husk powder, diatomaceous earth, white clay, silica (e.g. fumed silica, precipitated silica, fused silica, dolomite, anhydrous silicic acid, hydrous silicic acid, amorphous spherical silica, and the like), and carbon black; fillers such as diatomite, sintered clay, clay, talc, titanium oxide, bentonite, organic bentonite, ferric oxide, fine aluminum powder, flint powder, active zinc oxide, zinc powder, zinc carbonate, shirasu balloons, glass microballoons, organic microballoons of phenol resin or vinylidene chloride resin, and resin powders such as PVC powder and PMMA powder; and fibrous fillers such as asbestos, glass fiber, glass filament, carbon fiber, Kevlar fiber, and polyethylene fiber. Preferred among these fillers are precipitated silica, fumed silica, fused silica, dolomite, carbon black, titanium oxide, talc, and the like. Some of these fillers slightly function as thermally conductive fillers and others (such as carbon fiber, various metal powders, various metal oxides, and various organic fibers) can be used as excellent thermally conductive fillers depending on the composition, synthesis method, degree of crystallinity, and crystal structure.

<Viscosity of Thermally Conductive Curable Resin Composition Before Curing>

The thermally conductive curable resin composition has fluidity but is relatively highly viscous, with a viscosity before curing at 23° C. of 30 Pa·s or more. If the viscosity before curing is less than 30 Pa·s, workability during application of the composition will decrease because, for example, its cured product may run off the application site due to a low viscosity. The viscosity before curing is preferably 40 Pa·s or more, and more preferably 50 Pa·s or more. The upper limit of the viscosity before curing is 3000 Pa·s or less, preferably 2000 Pa·s or less. If the viscosity is more than 3000 Pa·s, the thermally conductive curable resin composition may be difficult to apply or inject, or air may be entrapped during application, thus causing a reduction in thermal conductivity. The viscosity before curing refers to a value measured with a BH viscometer at 2 rpm in an atmosphere of 23° C.

<Thermal Conductivity of Thermally Conductive Curable Resin Composition>

The thermally conductive curable resin composition has a thermal conductivity of 0.5 W/(m·K) or more. The thermally conductive curable resin composition is required to have high thermal conductivity because heat must be efficiently transferred to the outside. The thermal conductivity is preferably 0.7 W/(m·K) or more, more preferably 0.8 W/(m·K) or more, and still more preferably 0.9 W/(m·K) or more. The use of such a highly thermally conductive resin allows heat from electronic components to be efficiently released to the electromagnetic shielding case or substrate as compared to when the electronic components are in contact with air.

<Thermal Conductivity of Cured Product of Thermally Conductive Curable Resin Composition>

The thermally conductive curable resin composition after curing preferably has a thermal conductivity of 0.5 W/(m·K) or more. The thermal conductivity of the cured product is more preferably 0.7 W/(m·K) or more, still more preferably 0.8 W/(m·K) or more, and particularly preferably 0.9 W/(m·K) or more, because heat must be efficiently transferred to the outside. The use of such a highly thermally conductive resin allows heat from electronic components to be efficiently released to the electromagnetic shielding case or substrate as compared to when the electronic components are in contact with air.

The thermal conductivity of the cured product obtained by curing the thermally conductive curable resin composition is preferably within a range of plus/minus 20% of the thermal conductivity of the thermally conductive curable resin composition.

<Hardness of Cured Product>

The hardness of the cured product of the thermally conductive resin composition is preferably low so that thermal expansion or strain at high temperatures can be absorbed. In order to prevent peeling or cracking due to a difference in linear expansion coefficient between materials, the hardness is preferably at least 10 but not more than 99, more preferably at least 10 but not more than 95, and still more preferably at least 20 but not more than 90 as measured with an Asker C-type hardness meter.

<180-Degree Peel Strength of Cured Product>

In the present invention, the cured product of the thermally conductive resin composition preferably has a 180-degree peel strength on a SUS 304 plate (at a peeling rate of 300 mm/min) of 0.05 N/25 mm or more, more preferably 0.075 N/25 mm or more, and particularly preferably 0.10 N/25 mm or more. Also, the peel strength is preferably 1.00 N/25 mm or less, more preferably 0.75 N/25 mm or less, and particularly preferably 0.50 N/25 mm or less. A cured product having a peel strength of less than 0.05 N/25 mm may have poor adhesion to the electronic component and the electromagnetic shielding case, which may increase contact thermal resistance and reduce heat dissipation. Also, if the peel strength is more than 1.00 N/25 mm, the cured product tends not to be easily peeled off especially from a bumpy electronic component or electromagnetic shielding case, resulting in reduced workability.

The 180-degree peel strength on a SUS substrate is measured as follows, for example.
1. The thermally conductive curable resin composition is applied at a thickness of 200 µm to a PET film having a length of 150 mm, a width of 20 mm, and a thickness of 25 µm, and the PTE film is then bonded to a SUS 304 plate by passing a 2-kg roller back and forth one time.
2. The assembly is cured at 23° C. and 50% RH for one day.
3. Using a universal tensile tester, a peeling test is performed at a peeling angle of 180 degrees and a tensile rate of 300 mm/min.

In the 180-degree peeling test, it is preferred that the cured product should not undergo cohesive peeling but interfacial peeling. In the case of cohesive peeling, the cured product may leave residue on both sides when peeled, resulting in poor working efficiency.

Whether the cured product can be interfacially peeled can be determined by a peeling test. More specifically, for example, 5 g of the thermally conductive curable resin composition is applied to a memory substrate (MV-DN333-A512M available from Buffalo Inc.), and cured at 23° C. and 50% RH for one day. Then, peeling is carried out for five minutes. If the residue level of the cured product after peeling is rated A (no cured product residue) or B (partial cured product residue), the cured product is determined as capable of being interfacially peeled.

<Heat Dissipation Structure>

FIG. 1 shows an embodiment of the heat dissipation structure of the present invention. An electronic component 13a and an electronic component 13b are fixed on a substrate 12, and an electromagnetic shielding case 11 that covers the electronic components 13a and 13b is placed on the substrate 12. A cured product 14 in the electromagnetic shielding case 11 is obtained by filling and subsequent curing of a thermally conductive curable composition.

<Electronic Component>

The electronic component used in the present invention has a heat density of 0.2 W/cm$^2$ to 500 W/cm$^2$. Electronic components with a heat density of 0.2 W/cm$^2$ or more tend to generate high-temperature heat during operation, and thus to easily show reduced properties. The electronic component is not particularly limited, as long as it generates heat during operation of an electronic device or precision apparatus. The heat density of the electronic component is preferably 0.3

W/cm² or more, and more preferably 0.5 W/cm² or more. Also, the heat density is preferably 300 W/cm² or less, and more preferably 100 W/cm² or less. The heat density refers to the thermal energy released per unit area per unit time.

Examples of such electronic components include microprocessors such as CPU, GPU, and the like, digital signal processors (DSP), power amplifiers, RF transceiver ICs, ICs for amplification, ICs for signal processing, LNAs, antenna devices, filter devices, quartz devices, various chips for communication, wireless LANs, Bluetooth (registered trademark), memory devices, power management devices, vibration motors, various sensor devices for illumination, acceleration, geomagnetism, pressure, or the like, gyroscopes, various processors, various modules such as LEDs, integrated circuits, transistors, diodes, resistors, capacitors, and inductors.

There may be only one or multiple electronic components mounted on the substrate. Likewise, there may be only one or multiple electronic components in the electromagnetic shielding case on the substrate. In the case where multiple electronic components are mounted on the substrate, the heights of these electronic components from the substrate do not have to be the same. If the uncured thermally conductive curable resin composition is placed before it is cured, the resulting thermally conductive curable resin composition can adhere even to the electronic components whose heights are different, and thus can efficiently transfer heat generated from the electronic components to the electromagnetic shielding case or substrate.

The temperature of the electronic component is preferably adjusted to 130° C. or lower, more preferably 120° C. or lower, and still more preferably 111° C. or lower, so that it is equal to or lower than the heat-resistant temperature thereof. If the temperature is higher than 130° C., semiconductor elements and others forming the electronic component may work slowly or break down. Depending on the particular electronic device, the heat-resistant temperature of the electronic component may be limited to 120° C. or lower. Moreover, it is preferred to use a cured product of the thermally conductive curable resin composition whose heat-resistant temperature is equal to or higher than the temperature of the electronic component. The temperature of the electronic component is preferably 0° C. or higher.

<Electromagnetic Shielding Case>

The materials for the electromagnetic shielding case are not particularly limited, as long as they enable the achievement of electromagnetic shielding properties by reflecting, transmitting, or absorbing electromagnetic waves. Examples include metal materials, plastic materials, various magnetic materials, and carbon materials. Particularly, metal materials can be suitably used in view of electromagnetic shielding properties (high conductivity and magnetic permeability), material strength, processability, and cost.

The metal material is suitably a metal material consisting only of a metal element(s). Specific examples of the metal material consisting only of an elemental metal(s) include elements in group 1 of the periodic table such as lithium, sodium, potassium, rubidium, and cesium; elements in group 2 of the periodic table such as magnesium, calcium, strontium, and barium; elements in group 3 of the periodic table such as scandium, yttrium, and lanthanoids (such as lanthanum and cerium), and actinoids (such as actinium); elements in group 4 of the periodic table such as titanium, zirconium, and hafnium; elements in group 5 of the periodic table such as vanadium, niobium, and tantalum; elements in group 6 of the periodic table such as chromium, molybdenum, and tungsten; elements in group 7 of the periodic table such as manganese, technetium, and rhenium; elements in group 8 of the periodic table such as iron, ruthenium, and osmium; elements in group 9 of the periodic table such as cobalt, rhodium, and iridium; elements in group 10 of the periodic table such as nickel, palladium, and platinum; elements in group 11 of the periodic table such as copper, silver, and gold; elements in group 12 of the periodic table such as zinc, cadmium, and mercury; elements in group 13 of the periodic table such as aluminum, gallium, indium, and thallium; elements in group 14 of the periodic table such as tin and lead; and elements in group 15 of the periodic table such as antimony and bismuth. Meanwhile, mention may be made of alloys, including stainless steel, copper-nickel alloys, brass, nickel-chromium alloys, iron-nickel alloys, zinc-nickel alloys, gold-copper alloys, tin-lead alloys, silver-tin-lead alloys, nickel-chromium-iron alloys, copper-manganese-nickel alloys, and nickel-manganese-iron alloys.

Mention may also be made of any various metal compounds containing a metal element and a non-metal element, provided that they contain any of the metal elements or alloys mentioned above and are capable of providing electromagnetic shielding properties. Examples thereof include metal sulfides such as copper sulfide; metal oxides such as iron oxide, titanium oxide, tin oxide, indium oxide, and cadmium tin oxide; and metal complex oxides.

Preferred among these metal materials are gold, silver, aluminum, iron, copper, nickel, stainless steel, copper-beryllium alloys (beryllium copper), magnesium alloys, iron-nickel alloys, permalloy, and copper-nickel alloys, and particularly preferred are aluminum, iron, copper, stainless steel, copper-beryllium alloys (beryllium copper), magnesium alloys, and iron-nickel alloys.

Examples of plastic materials include conductive plastics such as polyacetylene, polypyrrole, polyacene, polyphenylene, polyaniline, and polythiophene.

Examples of magnetic materials include soft magnetic powder, various ferrites, and zinc oxide whiskers. The magnetic material is suitably a ferromagnetic material that exhibits ferromagnetism or ferrimagnetism. Specific examples include highly magnetically permeable ferrites, pure iron, silicon atom-containing iron, nickel-iron alloys, iron-cobalt alloys, highly magnetically permeable amorphous metal materials, iron-aluminum-silicon alloys, iron-aluminum-silicon-nickel alloys, and iron-chromium-cobalt alloys.

Carbon materials such as graphite may also be mentioned.

The electromagnetic shielding case is intended to prevent leakage of electromagnetic waves generated from electronic components on a substrate to the outside. The electromagnetic shielding case may have any structure that is capable of providing electromagnetic shielding properties.

In general, the electromagnetic shielding case is placed on a ground layer on a substrate to enclose electronic components that are the source of electromagnetic waves, as shown in FIG. 1. The electromagnetic shielding case and the ground layer on the substrate are usually joined by solder, a conductive material or the like.

The electromagnetic shielding case may have a hole or opening as long as electromagnetic shielding properties are not impaired over a range from low- to high-frequency waves. The electromagnetic shielding case may be an integrated type or a separable type that can be separated into two or more parts, e.g., a square box-shaped shielding case and a lid-shaped shielding cover. In the former case, the thermally conductive curable resin composition may be injected into the electromagnetic shielding case through a hole. In the latter case, the thermally conductive curable resin composition may be applied to fully cover electronic component (s) on a substrate on which the square box-shaped shielding case is placed, and then the lid-shaped shielding cover may be placed. Moreover, in the repairing step, the thermally conductive resin in the electromagnetic shielding case may be removed after the electromagnetic shielding case is removed from the substrate; or the thermally conductive resin may be removed after the lid-shaped shielding cover is removed, with the electromagnetic shielding case remaining in place. In such a manner, the electronic device can be repaired.

The electromagnetic shielding case preferably has higher thermal conductivity because such an electromagnetic shielding case has more uniform temperature distribution and can effectively transfer heat generated from electronic components in the electromagnetic shielding case to the outside. In view of improving heat dissipation, the thermal conductivity of the electromagnetic shielding case is preferably 1 W/(m·K) or more, more preferably 3 W/(m·K) or more, still more preferably 5 W/(m·K) or more, and most preferably 10 W/(m·K) or more. The thermal conductivity of the electromagnetic shielding case is preferably 10000 W/(m·K) or less.

<Method for Filling Thermally Conductive Curable Resin Composition>

Common methods for the application or injection of a liquid resin can be used to fill the thermally conductive curable resin composition into the electromagnetic shielding case. Examples include known application methods, such as spin coating, roll coating, dipping, and spraying. The electromagnetic shielding case can also be filled by applying or injecting using a dispenser the thermally conductive curable resin composition from a container (e.g. a cartridge, a tube, or a syringe) in which the thermally conductive curable resin composition is charged. Alternatively, the thermally conductive curable resin composition may be directly applied or injected, without using a dispenser, from a container such as a cartridge, a tube, or a syringe.

In filling, it is preferred that at least a part of the electromagnetic shielding case be placed on the substrate. For example, in the case of the separable type electromagnetic shielding case whose top can be separated like a lid, the thermally conductive curable resin composition can be applied or injected to cover the electronic component (s) after the lid is removed, and then the lid may be closed. In the case of the electromagnetic shielding case partially having a hole or opening, the thermally conductive curable resin composition can be injected through the hole or opening.

After the thermally conductive curable resin composition is filled, it is left to stand at room temperature or heated for curing. The thermally conductive curable resin composition filled in the electromagnetic shielding case is preferably in contact with both the electromagnetic shielding case and the electronic component (s) after curing, and is more preferably in contact also with the substrate. When the cured product is in contact with the electromagnetic shielding case and/or the substrate, heat from the electronic component (s) can be efficiently transferred to the electromagnetic shielding case and/or the substrate.

The cured product may have any shape, such as a sheet-like, tape-like, strip-like, disk-like, toric, blockish, or amorphous shape.

<Personal Digital Assistant and Electronic Device>

The personal digital assistant and the electronic device of the present invention include the heat dissipation structure of the present invention.

The personal digital assistant and electronic device are not particularly limited, as long as they internally include an electronic component which is covered by an electromagnetic shielding case and mounted on a substrate. Examples of the personal digital assistants (PDAs) include electronic organizers, PHSs, mobile phones, smartphones, smartbooks, tablet computers, digital media players, and digital audio players. Examples of the electronic devices include devices such as supercomputers, mainframes, servers, minicomputers, work stations, personal computers, portables, plugs, game machines, smart TVs, laptops, notebook computers (CULV, tablet PCs, netbooks, ultra-mobile PCs, smartbooks, ultrabooks), pocket computers, portable game machines, electronic dictionaries, electronic book readers, portable data terminals, and head mount displays; display devices such as liquid crystal displays, plasma displays, surface-conduction electron-emitter displays (SEDs), LEDs, organic ELs, inorganic ELs, liquid crystal projectors, and clocks and watches; image forming devices such as ink jet printers (ink head) and electrophotographic devices (developing devices, anchoring devices, heat rollers, heat belts); semiconductor-related parts such as semiconductor devices, semiconductor packages, semiconductor encapsulation cases, semiconductor die bonding machines, CPUs, memories, power transistors, and power transistor cases; wiring substrates such as rigid wiring boards, flexible wiring boards, ceramic wiring boards, build-up wiring boards, and multi-layer substrates (these wiring boards also include printed wiring boards and the like); manufacturing equipment such as vacuum processing devices, semiconductor manufacturing equipment, and display device manufacturing equipment; thermal insulation systems such as insulating materials, vacuum insulating materials, and radiation insulating materials; data recording devices such as DVDs (optical pickups, laser generation devices, laser receiving devices) and hard disk drives; image recording devices such as cameras, video cameras, digital cameras, digital video cameras, microscopes, and CCDs; and battery equipment such as battery chargers, lithium-ion cells, fuel cells, and solar cells.

<Method for Repairing Electronic Device>

The method for repairing an electronic device according to the present invention includes removing a cured product of a thermally conductive curable resin composition from an assembly including the cured product joined to a heat-generating element and/or heat-dissipating element, the thermally conductive curable resin composition containing a curable liquid resin (I) and a thermally conductive filler (II), having a viscosity at 23° C. of 30 Pa·s to 3000 Pa·s and a thermal conductivity of 0.5 W/(m·K) or more, and being curable by moisture or heat, wherein the cured product has a 180-degree peel strength on a SUS substrate of 0.05 N/25 mm to 1.00 N/25 mm.

The method may include, after the removal of the cured product, joining the heat-generating element and/or the heat-dissipating element to a cured product of a thermally conductive resin composition that is the same as or different from the cured product.

The terms "repair" and "repairing" as used herein refer to an act of repairing in a broad sense. In other words, the terms encompass acts of checking, replacement of components, and remanufacturing.

The electronic device is not particularly limited, as long as it includes an assembly including the thermally conductive resin joined to a heat-generating element and/or heat-dissipating element. Examples thereof include personal digital assistants and electronic devices described above.

The heat-generating element is also not particularly limited and may be an electronic component as described above. The heat-generating element is preferably mounted on a substrate.

The heat-dissipating element is also not particularly limited and may be an electromagnetic shielding case as described above. The heat-dissipating element is preferably placed to enclose the heat-generating element, on a substrate on which the heat-generating element is mounted.

The form of the heat-dissipating element is not particularly limited. The form of the heat-dissipating element is preferably such that it can be separated into two or more parts, e.g., a case and a cover, because the thermally conductive resin can be removed by only removing the cover part, with the case part remaining in place. In the case of an integrated type heat-dissipating element, the thermally conductive resin may be removed after the heat-dissipating element is removed from the substrate.

The thermally conductive curable resin composition forming the thermally conductive resin is not particularly limited, as long as the above conditions are satisfied. For example, the thermally conductive curable resin composition may be as mentioned above.

According to the present invention, the thermally conductive resin has a 180-degree peel strength on a SUS substrate within a certain range, and thus can be easily peeled off from the joined assembly, which permits the electronic device to be easily repaired.

EXAMPLES

Embodiments and effects of the present invention are described below by reference to examples, but the present invention is not limited to these examples.

(Synthesis 1)

In a nitrogen atmosphere, a 250-L reactor was charged with CuBr (1.09 kg), acetonitrile (11.4 kg), butyl acrylate (26.0 kg), and diethyl 2,5-dibromoadipate (2.28 kg), and the mixture was stirred at 70° C. to 80° C. for about 30 minutes. Then pentamethyldiethylenetriamine was added to the mixture and a reaction was started. After 30 minutes from the start of the reaction, butyl acrylate (104 kg) was continuously added to the mixture over two hours. During the reaction, pentamethyldiethylenetriamine was added as needed so that the internal temperature was maintained at 70° C. to 90° C. The total amount of pentamethyldiethylenetriamine used up to this point was 220 g. After four hours from the start of the reaction, the mixture was heated while stirring under reduced pressure at 80° C. to remove volatile matter. Thereto were added acetonitrile (45.7 kg), 1,7-octadiene (14.0 kg), and pentamethyldiethylenetriamine (439 g), and the mixture was continuously stirred for 8 hours. The mixture was heated while stirring under reduced pressure at 80° C. to remove volatile matter.

To the resulting concentrate was added toluene to dissolve the polymer therein, followed by adding diatomaceous earth as filtering aid, and aluminum silicate and hydrotalcite as adsorbent. The mixture was then heated while stirring in an oxygen-nitrogen mixed gas atmosphere (oxygen concentration: 6%) at an internal temperature of 100° C. The solids in the mixture were removed by filtering, and the filtrate was heated while stirring under reduced pressure at an internal temperature of 100° C. to remove volatile matter.

To the resulting concentrate were further added aluminum silicate and hydrotalcite as adsorbent and an anti-heat aging agent, and the mixture was heated while stirring under reduced pressure (average temperature: about 175° C.; degree of vacuum: Torr or lower). Further, aluminum silicate and hydrotalcite were added as adsorbent and an antioxidant was also added. Then, the resulting mixture was heated while stirring in an oxygen-nitrogen mixed gas atmosphere (oxygen concentration: 6%) at an internal temperature of 150° C.

To the resulting concentrate was added toluene to dissolve the polymer therein. Then the solids in the mixture were removed by filtering, and the filtrate was heated while stirring under reduced pressure to remove volatile matter. Thus, a polymer containing an alkenyl group was obtained.

The polymer containing an alkenyl group, dimethoxymethylsilane (2.0 molar equivalents to the alkenyl group), methyl orthoformate (1.0 molar equivalent to the alkenyl group), a platinum catalyst (a xylene solution of bis(1,3-divinyl-1,1,3,3-tetramethyldisiloxane)-platinum complex catalyst; hereinafter referred to as platinum catalyst) (10 mg calculated as platinum per kg of polymer) were mixed, and the mixture was heated under stirring at 100° C. in a nitrogen atmosphere. After confirming the disappearance of the alkenyl group, the reaction mixture was concentrated to provide a poly(n-butyl acrylate) resin (I-1) having a dimethoxysilyl group at an end. The obtained resin had a number average molecular weight of about 26,000 and a molecular weight distribution of 1.3. The average number of silyl groups introduced per molecule of resin was about 1.8 as determined by $^1$H NMR analysis.

(Synthesis 2)

Using polyoxypropylenediol with a number average molecular weight of about 2,000 as initiator, propylene oxide was polymerized in the presence of a zinc hexacyanocobaltate-glyme complex catalyst to obtain a polypropylene oxide having a number average molecular weight of 25,500 (as measured using a solvent delivery system (HLC-8120 GPC available from Tosoh Corporation), a column (TSK-GEL H type available from Tosoh Corporation), and a solvent (THF) relative to polystyrene standards). Subsequently, 1.2 equivalents of NaOMe in methanol was added to the hydroxyl groups of the hydroxyl-terminated polypropylene oxide and the methanol was distilled off. Further, the terminal hydroxyl groups were converted into allyl groups by adding allyl chloride. Unreacted allyl chloride was removed under reduced pressure. Then 100 parts by weight of the resulting crude allyl-terminated polypropylene oxide was combined with 300 parts by weight of n-hexane and 300 parts by weight of water. After stirring, the water was removed from the mixture by centrifugation. The resulting hexane solution was further combined with 300 parts by weight of water, followed by stirring. After the water was removed again by centrifugation, the hexane was removed under reduced pressure. Thus, an allyl-terminated bifunctional polypropylene oxide having a number average molecular weight of about 25,500 was obtained.

Then 100 parts by weight of the obtained allyl-terminated polypropylene oxide was reacted with 0.95 parts by weight of trimethyoxysilane at 90° C. for five hours in the presence of 150 ppm of a isopropanol solution of a platinum-vinylsiloxane complex (platinum content: 3 wt %) as catalyst. Thus, a trimethoxysilyl-terminated polyoxypropylene polymer (I-2) was obtained. The average number of terminal trimethoxysilyl groups per molecule was 1.3 as determined by $^1$H NMR in the same manner as above.

Examples 1 to 4, Comparative Example 2

The resin (I-1) obtained in Synthesis 1 (90 parts by weight), the resin (I-2) obtained in Synthesis 2 (10 parts by weight), a plasticizer (Monocizer W-7010 available from DIC; 100 parts by weight), an antioxidant (Irganox 1010; 1 part by weight), and thermally conductive fillers shown in Table 1 were sufficiently stirred and kneaded with hands. Then the mixture was dehydrated under vacuum while kneading under heat using a 5-L butterfly mixer. After the completion of dehydration, the mixture was cooled and mixed with a dehydrating agent (A171; 2 parts by weight) and curing catalysts (tin neodecanoate and neodecanoic acid; 4 parts by weight each). Thus, a thermally conductive curable resin composition was obtained. After the obtained thermally conductive curable resin composition was measured for viscosity and thermal conductivity, the thermally conductive curable resin composition was filled in simple models shown in FIGS. 2 and 3, and the temperature and the presence or absence of leakage of the resin from their electromagnetic shielding cases were evaluated. The thermal conductivity of the cured product was also measured. Table 1 shows the results.

Comparative Example 1

Evaluation was carried out in the same manner as in Example 1, except that the thermally conductive curable resin composition was not used. Table 1 shows the evaluation results.

Examples 5 and 6

Figure 4:
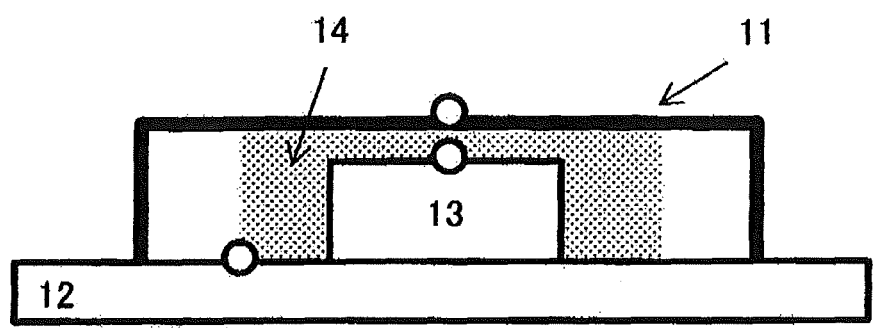
FIG. 4 is a schematic cross-sectional view of an example of the present invention.
Figure 5:
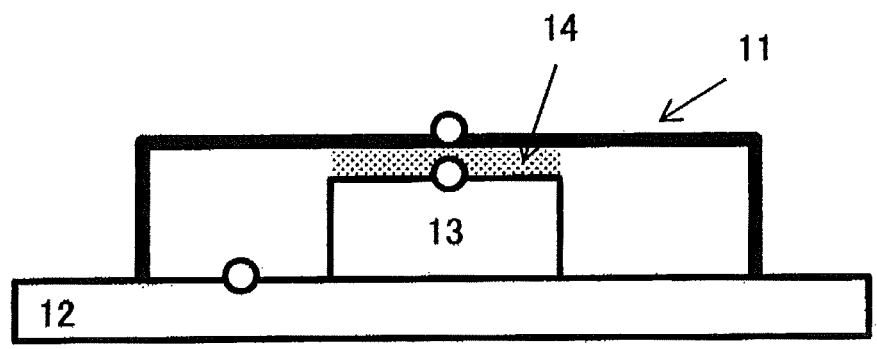
FIG. 5 is a schematic cross-sectional view of an example of the present invention.

The resin (I-1) obtained in Synthesis 1 (90 parts by weight), the resin (I-2) obtained in Synthesis 2 (10 parts by weight), a plasticizer (Monocizer W-7010 available from DIC; 100 parts by weight), an antioxidant (Irganox 1010; 1 part by weight), and thermally conductive fillers shown in Table 2 were sufficiently stirred and kneaded with hands. Then the mixture was dehydrated under vacuum while kneading under heat using a 5-L butterfly mixer. After the completion of dehydration, the mixture was cooled and mixed with a dehydrating agent (A171; 2 parts by weight) and curing catalysts (tin neodecanoate and neodecanoic acid; 4 parts by weight each). Thus, a thermally conductive curable resin composition was obtained. After the obtained thermally conductive curable resin composition was measured for viscosity and thermal conductivity, the thermally conductive curable resin composition was filled in simple models as shown in FIGS. 4 and 5, and the temperature and the presence or absence of leakage of the resin from their electromagnetic shielding cases were evaluated. The thermal conductivity of the cured product was also measured. Table 2 shows the results.

<Evaluation>
(Viscosity of Thermally Conductive Curable Resin Composition)
The viscosity of the thermally conductive curable resin compositions was measured using a BH viscometer at 2 rpm in an atmosphere of 23° C. and 50% RH.
(Thermal Conductivity of Thermally Conductive Curable Resin Composition)
The thermally conductive curable resin compositions were wrapped in Saran Wrap (registered trademark), and then measured for thermal conductivity using a hot disk thermal conductivity meter (TPA-501 available from Kyoto Electronics Manufacturing Co., Ltd.) by sandwiching a sensor (size: 4φ) between two specimens.
(Thermal Conductivity of Thermally Conductive Curable Resin Composition after Curing)
The thermally conductive curable resin compositions were cured at 23° C. and 50% RH for one day, and two disk specimens having a thickness of 3 mm and a diameter of 20 mm were prepared from each cured product. The thermal conductivity of the cured products was measured using a hot disk thermal conductivity meter (TPA-501 available from Kyoto Electronics Manufacturing Co., Ltd.) by sandwiching a sensor (size: 4φ) between the two specimens.
(Measurement of Temperatures of Electronic Component, Substrate, and Electromagnetic Shielding Case)
The simple models shown in FIGS. 2 and 3 were prepared, and the temperature of the electronic component(s), substrate, and electromagnetic shielding case of each model was measured using a Teflon (registered trademark)-insulated ultrafine duplex thermocouple wire (TT-D-40-SLE available from OMEGA Engineering, Inc.). The temperature values are measured after the electronic component models were allowed to generate heat for one hour.
The simple models shown in FIGS. 2 to 5 all had the same materials and the same size as shown below.
11: electromagnetic shielding case (made of SUS (thickness: 0.3 mm), 20 mm×20 mm×1.40 mm)
12: substrate (made of glass epoxy, 60 mm×60 mm×0.75 mm)
13: electronic component (alumina heat-generating element (amount of heat generation: 1 W; heat density: 1 W/cm$^2$), 10 mm×10 mm×1.05 mm)
14: thermally conductive curable resin composition (or cured product)
○ (mark): thermocouple mounting position
(Leakage of Resin from Electromagnetic Shielding Case)
After filling the electromagnetic shielding case with each thermally conductive curable resin composition, the presence or absence of leakage from the system was visually determined.

TABLE 1

|  |  |  | Example 1 | Example 2 | Example 3 | Example 4 | Comparative Example 1 | Comparative Example 2 |
|---|---|---|---|---|---|---|---|---|
| Thermally conductive filler | Round alumina | phr | — | — | — | 1100 | — | — |
|  | Aluminum hydroxide | phr | 250 | 450 | 550 | — | — | — |
|  | Zinc oxide | phr | 50 | 100 | 450 | 500 | — | — |
| Viscosity of thermally conductive curable resin composition |  | Pa·s | 50 | 200 | 400 | 500 | — | 10 |
| Thermal conductivity of thermally conductive curable resin composition |  | W/(m·K) | 0.5 | 1.0 | 2.0 | 2.5 | — | 0.2 |
| Thermal conductivity of cured product |  | W/(m·K) | 0.5 | 1.0 | 2.1 | 2.4 | — | 0.2 |
| Filling |  |  | Performed | Performed | Performed | Performed | Not performed | Performed |
| Temperature measurement | Electromagnetic shielding case | ° C. | 87 | 87 | 86 | 87 | 84 | 85 |

TABLE 1-continued

|  |  | Example 1 | Example 2 | Example 3 | Example 4 | Comparative Example 1 | Comparative Example 2 |
|---|---|---|---|---|---|---|---|
| Electronic component | °C. | 88 | 85 | 83 | 85 | 116 | 102 |
| Substrate | °C. | 74 | 74 | 75 | 75 | 72 | 72 |
| Leakage of resin from system |  | No | No | No | No | No | Yes |

TABLE 2

Figure 2:
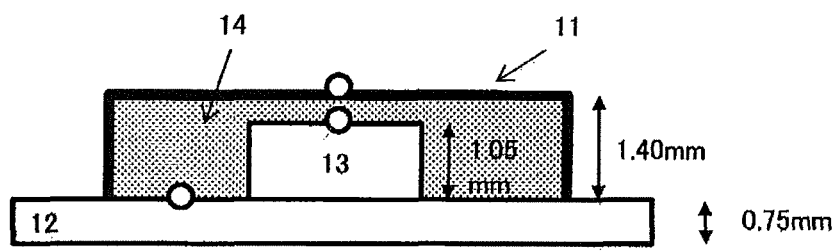
FIG. 2 is a schematic cross-sectional view of an example of the present invention.
Figure 3:
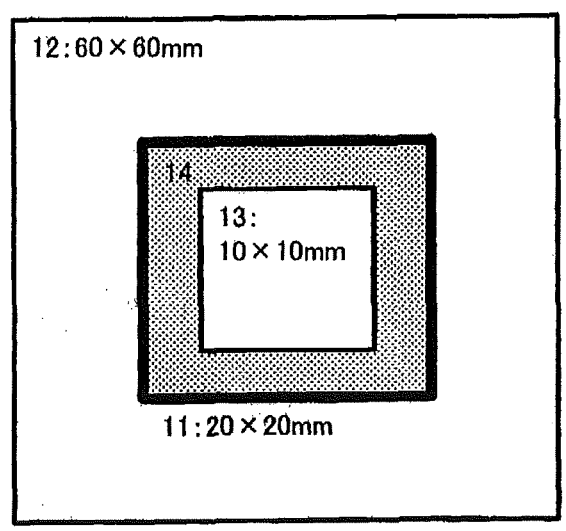
FIG. 3 is a schematic top view of an example of the present invention.

|  |  |  | Example 2 | Example 5 | Example 6 | Comparative Example 1 |
|---|---|---|---|---|---|---|
| Thermally conductive filler | Round alumina | phr | — | — | — | — |
|  | Aluminum hydroxide | phr | 450 | 450 | 450 | — |
|  | Zinc oxide | phr | 100 | 100 | 100 | — |
| Viscosity of thermally conductive curable resin composition |  | Pa · s | 200 | 200 | 200 | — |
| Thermal conductivity of thermally conductive curable resin composition |  | W/(m · K) | 1.0 | 1.0 | 1.0 | — |
| Thermal conductivity of cured product |  | W/(m · K) | 1.0 | 1.0 | 1.0 | — |
| Filling |  |  | Performed | Performed | Performed | Not performed |
| Filled portion |  |  | FIG. 2 | FIG. 4 | FIG. 5 | — |
| Temperature measurement | Electromagnetic shielding case | °C. | 87 | 84 | 87 | 84 |
|  | Electronic component | °C. | 85 | 85 | 88 | 116 |
|  | Substrate | °C. | 74 | 73 | 68 | 72 |
| Leakage of resin from system |  |  | No | No | No | No |

As shown in Table 1, Examples 1 to 4 exhibited great decreases in the temperature of the electronic component and increases in the temperature of the electromagnetic shielding case and the substrate as compared with Comparative Example 1, because the thermally conductive curable resin composition was applied so as to be in contact with the electromagnetic shielding case and substrate and with electronic component in these examples. This indicates that the heat generated from the electronic component was transferred to the electromagnetic shielding case and the substrate. Moreover, as shown in Table 2, in Example 6 in which the thermally conductive curable resin composition was only applied to the top of the electronic component to be in contact with the electromagnetic shielding case, the temperature of the electronic component was greatly reduced, and although the heat was not transferred to the substrate, the heat was transferred to the electromagnetic shielding case, which means that the heat could be dissipated. In contrast, in Comparative Example 2 in which no thermally conductive filler was used, not only the above effect was small, but also leakage of the resin from the electromagnetic shielding case was observed because the viscosity was low.

Example 7

The resin (I-1) obtained in Synthesis 1 (100 parts by weight), a plasticizer (DIDP available from J-PLUS Co., Ltd.; 100 parts by weight), an antioxidant (Irganox 1010 available from Ciba Japan K.K.; 1 part by weight), and thermally conductive fillers (AS-40 (alumina available from Showa Denko K.K.)/zinc oxide (available from Sakai Chemical Industry Co., Ltd)=1070/500 (parts by weight)) were sufficiently stirred and kneaded with hands. Then the mixture was dehydrated under vacuum while kneading under heat using a 5-L butterfly mixer. After the completion of dehydration, the mixture was cooled and mixed with a dehydrating agent (A171 available from Dow Corning Toray Co., Ltd.; 4 parts by weight) and a curing catalyst (tin neodecanoate U-50H available from NITTO KASEI KOGYO K.K.; 4 parts by weight). Thus, a thermally conductive curable resin composition was obtained. Table 3 shows the evaluation results.

Example 8

The resin (I-1) obtained in Synthesis 1 (100 parts by weight), a plasticizer (DIDP; 100 parts by weight), an antioxidant (Irganox 1010; 1 part by weight), and thermally conductive fillers (BF-083 (aluminum hydroxide available from Nippon Light Metal Co., Ltd.)/zinc oxide=500/450 (parts by weight)) were sufficiently stirred and kneaded with hands. Then the mixture was dehydrated under vacuum while kneading under heat using a 5-L butterfly mixer. After the completion of dehydration, the mixture was cooled and mixed with a dehydrating agent (A171; 4 parts by weight) and a curing catalyst (tin neodecanoate U-50H; 4 parts by weight). Thus, a thermally conductive curable resin composition was obtained. Table 3 shows the evaluation results.

Example 9

The resin (I-1) obtained in Synthesis 1 (90 parts by weight), the resin (I-2) obtained in Synthesis 2 (10 parts by weight), a plasticizer (DIDP; 95 parts by weight), an antioxidant (Irganox 1010; 1 part by weight), and thermally conductive fillers (BF-083 (alumina hydroxide available from Nippon Light Metal Co., Ltd.)/zinc oxide=440/100 (parts by weight)) were sufficiently stirred and kneaded with hands. Then the mixture was dehydrated under vacuum while kneading under heat using a 5-L butterfly mixer. After the completion of dehydration, the mixture was cooled and mixed with a dehydrating agent (A171; 2 parts by weight) and a curing catalyst (tin neodecanoate U-50H; 4 parts by weight). Thus, a thermally conductive curable resin composition was obtained. Table 3 shows the evaluation results.

Comparative Example 3

Evaluation was carried out in the same manner as in the examples but using a thermally conductive curable elastomer (KE3467 available from Shin-Etsu Chemical Co., Ltd.). Table 3 shows the evaluation results.

Comparative Example 4

Evaluation was carried out in the same manner as in the examples but using a thermally conductive curable elastomer (SE4420 available from Dow Corning Toray Co., Ltd.). Table 3 shows the evaluation results.
<Evaluation>
(Viscosity of Thermally Conductive Curable Resin Composition)

The viscosity of the thermally conductive curable resin compositions was measured using a BS viscometer at 2 rpm in an atmosphere of 23° C. and 50% RH.

(Thermal Conductivity of Thermally Conductive Resin Composition after Curing)

The thermally conductive curable resin compositions were cured at 23° C. and 50% RH for one day, and two disk specimens having a thickness of 3 mm and a diameter of 20 mm were prepared from each cured product. The thermal conductivity of the cured products was measured using a hot disk thermal conductivity meter (TPA-501 available from Kyoto Electronics Manufacturing Co., Ltd.) by sandwiching a sensor (size: 4φ) between the two specimens.
(Hardness of Thermally Conductive Resin Composition after Curing)

The thermally conductive curable resin compositions were cured at 23° C. and 50% RH for one day, and specimens of the cured products (size: 20×20×6 (mm)) were prepared. Then, the hardness was measured using an Asker C-type hardness meter.
(180-Degree Peel Strength of Thermally Conductive Resin Composition after Curing)

The thermally conductive curable resin compositions were applied at a thickness of 200 μm to a PET film having a length of 150 mm, a width of 20 mm, and a thickness of 25 μm, and the PTE film was then bonded to a SUS 304 plate by passing a 2-kg roller back and forth one time. After the assembly was cured at 23° C. and 50% RH for one day, a peeling test was performed using a universal tensile tester at a peeling angle of 180 degrees and a tensile rate of 300 mm/min to measure the peel strength.
(Adhesion of Thermally Conductive Resin Composition after Curing)

Each thermally conductive curable resin composition (5 g) was applied to a memory substrate (MV-DN333-A512M available from Buffalo Inc.) and then cured at 23° C. and 50% RH for one day. Subsequently, using a thermal shock tester (ES-56L available from Hitachi Appliances, Inc.), a thermal shock test was performed for 100 cycles of −40° C. for 30 minutes and 85° C. for 30 minutes, and the degree of adhesion of the cured product was evaluated according to the following criteria.

A: Not peeled.
B: Partially peeled.
C: Completely peeled.
(Peelability of Thermally Conductive Resin Composition after Curing)

Each thermally conductive curable resin composition (5 g) was applied to a memory substrate (MV-DN333-A512M available from Buffalo Inc.) and then cured at 23° C. and 50% RH for one day. After the resulting cured product was subjected to peeling for five minutes, the residue level of the cured product was evaluated according to the following criteria.
A: No residue of the cured product was observed.
B: The cured product partially remained.
C: A large part of the cured product was left behind without being peeled.

TABLE 3

|  |  | Example 7 | Example 8 | Example 9 | Comparative Example 3 | Comparative Example 4 |
|---|---|---|---|---|---|---|
| Viscosity | Pa · s | 390 | 300 | 60 | 100 | 80 |
| Thermal conductivity | W/(m · K) | 2.6 | 1.9 | 1.1 | 2.4 | 2.3 |
| Hardness |  | 85 | 86 | 68 | 90 | 77 |
| 180-Degree peel strength | N/25 mm | 0.13 | 0.17 | 0.21 | 1.10 | 10.23 |
| Adhesion |  | A | A | A | A | A |
| Peelability |  | A | A | A | B | C |

As shown in Table 3, in the 180-degree peeling test, the peel strengths of Examples 7 to 9 were low, which demonstrates that the cured product can be easily peeled off from an intended heat-generating element (memory substrate in these examples). In contrast, the 180-degree peel strengths of Comparative Examples 3 and 4 were higher than 1.00 N/25 mm, and therefore a part or a large part of the cured product remained on the memory substrate, which indicates poor workability.

REFERENCE SIGNS LIST

11 Electromagnetic shielding case
12 Substrate
13 Electronic component
13a Electronic component a
13b Electronic component b
14 Thermally conductive curable resin composition (or cured product)

The invention claimed is:
1. A heat dissipation structure, obtained by filling and curing a thermally conductive curable resin composition in an electromagnetic shielding case on a substrate on which an electronic component with a heat density of 0.2 W/cm2 to 500 W/cm2 is mounted, the thermally conductive curable resin composition comprising a curable liquid resin (I) and a thermally conductive filler (II), having a viscosity at 23° C. of 30 Pa·s to 3000 Pa·s and a thermal conductivity of 0.5 W/(m·K) or more, and being curable by moisture wherein a cured product of the thermally conductive curable resin composition has a 180-degree peel strength on a SUS 304 plate of 0.05 N/25 mm to 1.00 N/25 mm.
2. The heat dissipation structure according to claim 1, wherein the curable liquid resin (I) is at least one of a curable acrylic resin and a curable polypropylene oxide resin.
3. The heat dissipation structure according to claim 1, wherein the cured product of the thermally conductive curable resin composition is in contact with both the electromagnetic shielding case and the electronic component.

4. The heat dissipation structure according to claim 1, wherein the thermally conductive curable resin composition after curing has a thermal conductivity of 0.5 W/(m·K) or more.

5. A personal digital assistant, comprising the heat dissipation structure as defined in claim 1.

6. An electronic device, comprising the heat dissipation structure as defined in claim 1.

7. The heat dissipation structure according to claim 2, wherein the curable liquid resin (I) comprises the curable acrylic resin and the curable polypropylene oxide resin.

8. The head dissipation structure according to claim 1, wherein the curable liquid resin (I) contains a hydrolysable silyl group at an end.

* * * * *